United States Patent [19]

Land

[11] Patent Number: 4,945,514

[45] Date of Patent: Jul. 31, 1990

[54] METHOD OF BISTABLE OPTICAL INFORMATION STORAGE USING ANTIFERROELECTRIC PHASE PLZT CERAMICS

[76] Inventor: Cecil E. Land, 2118 Gretta NE., Albuquerque, N. Mex. 87112

[21] Appl. No.: 200,104

[22] Filed: May 31, 1988

[51] Int. Cl.$^5$ .............................................. G11C 11/22
[52] U.S. Cl. ..................... 365/117; 365/145; 365/121; 350/374
[58] Field of Search ................ 365/117, 145, 109, 121; 350/355, 374

[56] References Cited

U.S. PATENT DOCUMENTS 3,978,458 8/1976 Vergnolle et al. .................. 365/145
3,998,523 12/1976 Otomo ................................. 365/121

OTHER PUBLICATIONS

Kumada et al., "An Electro-Optic Image Storage Device Using Field Induced Reversible Transitions Between AFE and FE Phases of PLZT Ceramics", Ferroelectrics, vol. 7, 1974, pp. 367–369.

Land et al., "Photoferroelectric Image Storage in PLZT Ceramics", Information Display, Spring 1977, pp. 20–23, 26.

Primary Examiner—Glenn A. Gossage

[57] ABSTRACT

A method for bistable storage of binary optical information includes an antiferroelectric (AFE) lead lanthanum zirconate titanate (PLZT) layer having a stable antiferroelectric first phase and a ferroelectric (FE) second phase obtained by applying a switching electric field across the surface of the device. Optical information is stored by illuminating selected portions of the layer to photoactivate an FE to AFE transition in those portions. Erasure of the stored information is obtained by reapplying the switching field.

11 Claims, 4 Drawing Sheets

METHOD OF BISTABLE OPTICAL INFORMATION STORAGE USING ANTIFERROELECTRIC PHASE PLZT CERAMICS

The U.S. Government has rights in this invention pursuant to Contract No. DE-AC04-76DP00789 between the Department of Energy and AT&T Technologies, Inc.

BACKGROUND OF THE INVENTION

The present invention relates to a method of storing binary optical information and, more particularly, to the use of photoactivated shifts in the phase transition between the ferroelectric (FE) and the antiferroelectric (AFE) phases within a polycrystalline PLZT (lead lanthanum zirconate titanate) ceramic or film containing device to store and erase binary optical information.

A photoferroelectric optical information storage device which uses the field-induced AFE-to-FE phase transistor in AFE-phase PLZT compositions to store high-resolution, high-contrast optical information was described in "Photoferroelectric Image Storage in Antiferroelectric-Phase PLZT Ceramics," by Cecil E. Land, *IEEE Trans. on Electron Device*, Vol. ED-26, No. 8, 1143–1147 (1979). In this device, the electric-field-induced AFE-to-FE phase transition is photoinhibited by exposure to near-UV light with photon energies equal to or greater than the band gap (about 3.4 eV). This storage device employs an intrinsic photoferroelectric effect similar to that occuring in FE-phase compositions. This photoferroelectric effect in the AFE-phase material provides a basis for erasable optical information storage such as photographic images with high resolution and contrast or holograms with large diffraction efficiencies. In unimplanted AFE-phase PLZT, the intrinsic photoferroelectric effect relies on photon absorption to photoexcite carriers into the conduction band and thereby to increase the threshold voltage for field-inducing the AFE-to-FE phase transition.

Both resolution and contrast of stored photographic images and the diffraction efficiency of stored holograms are substantially higher for storage in AFE-phase material than for comparable photoferroelectric storage in FE-phase compositions. The absence of domain structure in the AFE-phase removes a major source of light scattering and thereby increases contrast and/or diffraction efficiency of stored information.

SUMMARY OF THE INVENTION

The object of the invention is to use a light activated shift of the field-dependent phase transition between a metastable or a bias-stabilized ferroelectric (FE) phase and a stable antiferroelectric (AFE) phase in AFE-phase PLZT (lead lanthanum zirconate titanate) compositions in novel optical devices. The large intrinsic and extrinsic photosensitivities of the field-dependent phase transition between a metastable or a bias-stablized FE phase and a stable AFE phase in AFE-phase PLZT compositions have not been known previously. The AFE-phase PLZT compositions which exhibit these photosensitivities are necessarily near the room-temperature morphotropic AFE-FE phase boundary. The new devices may utilize optical bistability to store binary information or they may use a spectrum of partial phase transitions spatially arrayed to replicate exposure energy to achieve storage of gray-scale information. The photoactivated shift of the FE-to-AFE phase transition is such that it is sensitive to near-UV and visible (and to a lesser extent, near-IR) light energy, hence the method of the present invention which uses this phenomenon has wide applications as erasable and reusable optical information storage media or as bistable optical switch arrays.

DETAILED DESCRIPTION

Figure 1:
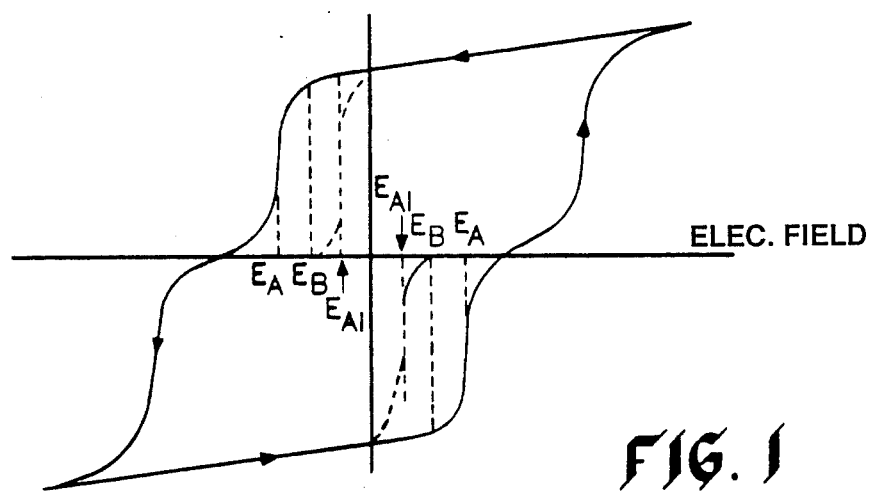
FIG. 1 shows the solarization versus electric field hysteresis characteristic for AFE-phase PLZT 7.6/70/30 which exhibits a field-induced metastable FE phase.

The present invention achieves optical bistability and a means of storing optical information in AFE-phase PLZT compositions by photoactivating a shift in the FE-to-AFE phase transition from a metastable or from a bias-stabilized FE-phase. The photoactivated shift in the phase transition is always toward the field-induced AFE-to-FE phase transition. Therefore, in compositions with a metastable FE phase, the phase transition is shifted toward zero field whereas, in the composition requiring bias stabilization of the FE phase, the phase transition is shifted to a higher field.

This photostorage effect in the AFE-phase PLZT is particularly applicable to binary optical information storage. The electric field threshold of the phase transition between a field-induced metabase FE phase or bias-stabilized FE phase and the stable AFE phase is sensitive not only to band-gap light but also to visible light. When the material is exposed to light, the threshold of the FE→AFE phase transition is shifted along the field axis toward the AFE→FE phase transition. Therefore, if a dc bias field is applied at the threshold of the FE→AFE phase transition and the surface of the ceramic is exposed to spatially modulated light, the areas illuminated above the exposure energy threshold will switch to the AFE phase and the dark areas will remain in the FE phase. Optical information is thereby stored between two well-defined states: the metastable or biased FE and the stable AFE phases. If the initial state is a metastable FE phase, the stored information is nonvolatile, hence it will remain after the bias field is removed.

Both the intrinsic and extrinsic photosensitivities of this AFE PTPS (phase transition photostorage) effect depend on the proximity of the AFE composition to the room-temperature morphotropic phase boundary between the rhombohedral FE phase and the orthorhombic AFE phase. Furthermore, the photosenstivities are slightly greater for compositions lying in the AFE phase region near the phase boundary than those in the FE phase region.

The AFE PTPS device is similar to known devices for photoferroelectric image storage in AFE- or FE-phase PLZT materials. An optical device in accordance with the present invention can comprise AFE-phase PLZT ceramic plates, 200 to 250 microns thick, with ITO (indium-tin oxide) electrodes sputter deposited on the two major surfaces. A PLZT material which can be used in the present invention has a general formula:

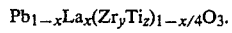
$Pb_{1-x}La_x(Zr_yTi_z)_{1-x/4}O_3$.

Preferable PLZT materials are where $x=0.76$ or 0.77, $y=0.7$ and $z=0.3$. Other PLZT materials can be used within the above-described general formula. For example, the ratio of Zr to Ti can vary between 68/32 and 85/15. When the amount x of La is varied, the amounts y and z respectively of Zr and Ti must be varied, so that the resulting PLZT material is on or near the boundary between the FE rhombohedral phase and the AFE orthorhombic phase and that the electric field threshold of the phase transition between a field-induced metastable or bias-stabilized FE phase and the stable AFE phase is sensitive to band-gap or visible light. Materials other than the PLZT materials described above can be used in the present invention if they exhibit a room temperature AFE phase, an electric field induced FE phase and, when exposed to light, the threshold of the FE→AFE phase transition is shifted along the field axis toward the AFE→FE phase transistion. Other phase transition materials can also be used in the present invention if they behave is a similar manner.

The nomenclature PLZT X/70/30 is commonly used to refer to PLZT materials. PLZT X/70/30 denotes a solid solution with X atom percent La, 70 mole percent $PbZrO_3$ and 30 mole percent $PbTiO_3$ prepared according to the formula: $Pb_{1-x}La_x(Zr_{0.7}Ti_{0.3})_{1-x/4}O_3$, where $x=0.01$ X. Thus, the PLZT compositions preferred for use in the present invention are X/70/30, with X=7.6 or 7.7 percent La and 70/30 designating the ratio of lead zirconate to lead titanate in the solid solution. The composition with X=7.6 exhibits a field-induced metastable FE phase at room temperature such as that illustrated by the P versus E hysteresis characteristics of FIG. 1. The X=7.7 composition exhibits a conventional AFE twin-loop P versus E hysteresis characteristic similar to that shown in FIG. 2.

The PLZT ceramic materials usable in the present invention can be implanted with ions, such $H^+$, $He^+$, $Ne^+$, $Ar^+$, as well as chemically reactive ions from O, In, Fe, Cr and Al to increase the photosensitivity of the PLZT. Such materials are described in U.S. Pat. No. 4,391,901 of Cecil E. Land et al., issued July 5, 1983, which is incorporated herein by reference.

EXAMPLES

In the experiments performed below, polished ceramic plates, 0.2 to 0.3 mm thick, of AFE-phase PLZT material with transparent conductive ITO (indium-tin-oxide) electrodes sputter-deposited on the two major surfaces were employed. For compositions with a field-induced metastable FE phase, optical information storage is achieved by first field-inducing the FE phase, applying a biasing field $E_B$ near the knee of the FE→AFE transition threshold (FIG. 1), and then exposing a surface of the device to spatially modulated light. Both photographic and holographic images, as well as binary information, have been stored by this technique. The FE→AFE phase transition threshold shifts from $E_A$ to $E_{AI}$ in areas illuminated above the exposure energy threshold. The phase transition shift is illustrated in FIG. 1. The illuminated areas undergo a transition from the FE to the AFE phase, while the dark areas remain in the FE phase. In the FE phase, the PLZT grains (crystallites) are birefringent and there is at least one FE domain per grain. In the AFE phase, the PLZT is optically isotropic and there is no FE domain structure. Stored information is therefore optically detectable using plane-polarized light or coherent light and an interferometer. The grain sizes of the PLZT ceramics used in these experiments are about 5 micrometers. The ceramics can be fabricated with grain sizes from about 1 micrometer to 30 micrometers. Stored bits with diameters as small as two to four grain diameters are possible. Optical information stored in the metastable FE phase is nonvolatile.

Figure 2:
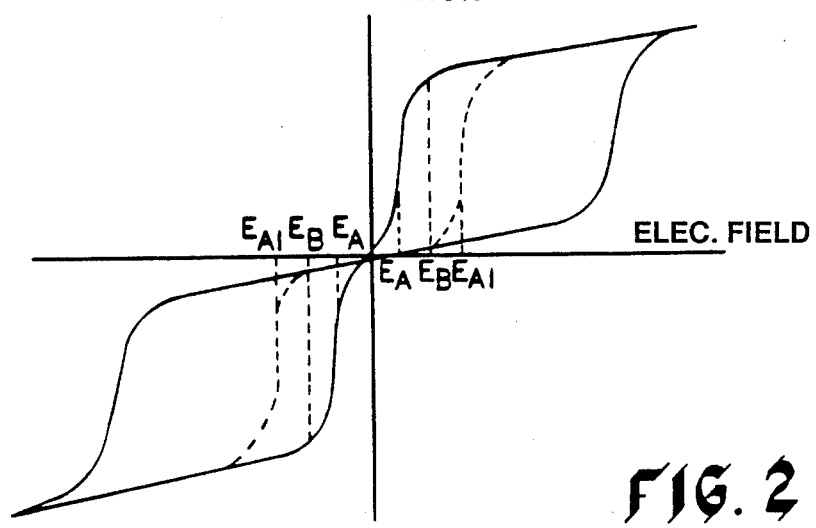
FIG. 2 shows the solarization versus electric field hysteresis characteristic for AFE-phase PLZT 7.7/70/30 which has typical AFE-phase, twin-loop behavior. The field-induced FE phase is unstable.

For compositions with a bias-stabilized FE phase, such as PLZT 7.7/70/30, optical information is stored by a process similar to that described above for the metastable FE-phase material. This process is illustrated in FIG. 2. However, for the bias-stabilized FE phase, stored information is volatile, and it disappears when the stabilizing bias is removed.

Optical bistability is inherent in the AFE phase transition photostorage (PTPS) processes as a result of the coexistence of the two phases (i.e., the FE and AFE) which represent highly reproducible storage states.

Figure 3:
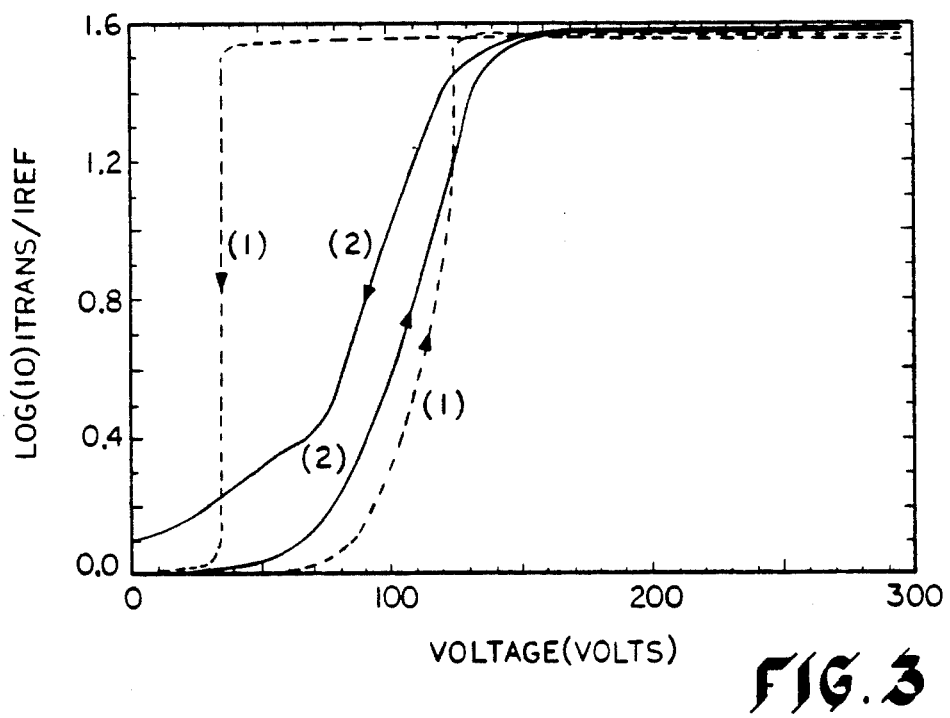
FIG. 3 depicts the normalized intensity of transmitted He-Ne laser light versus applied voltage for an unimplanted PLZT 7.7/70/30 composition (Sample AK): (1) with no illumination, and (2) with 12 mW/cm$^2$ intensity white light illumination.
Figure 4:
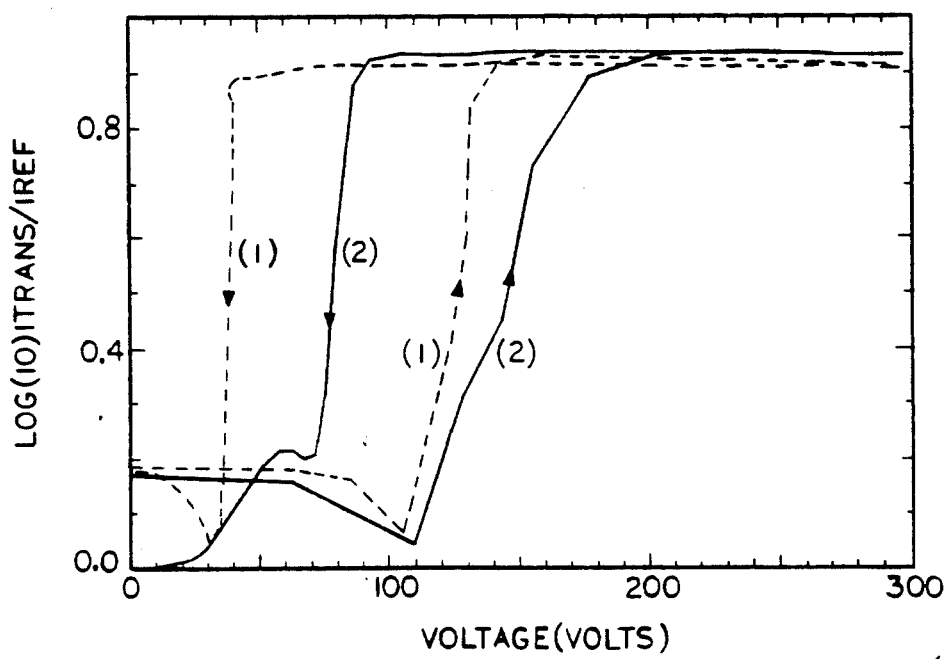
FIG. 4 depicts the normalized intensity of transmitted He-Ne laser light versus applied voltage for H$^+$-implanted PLZT 7.7/70/30 composition (Sample AO): (1) with no illumination, and (2) with 12 mW/cm$^2$ intensity white light illumination.

The visible photosensitivity of the AFE PTPS can be observed as a shift in the threshold of the FE→AFE phase transition when a device is illuminated with white light from an incandescent source. The significance of incandescent illumination is that there is no UV component in the light and the fact that the band gap is in the near-UV at approximately 3.4 eV (365 nm). A qualitative measure of the photosensitivity based on the above observation was obtained by aplotting the normalized intensity of transmitted polarized He-Ne laser light as a function of applied voltage while the ceramic was switched through the AFE→FE and the FE→AFE phase transitions, first with no illumination then with the surface illuminated with 12 mW/cm$^2$ white light. FIG. 3 illustrates the shift along the voltage axis of the two phase transitions for unimplanted PLZT 7.7/70/30 (Sample AK) before and after illumination with white light as described above. Similar curves for an identical sample (Sample AO) implanted with $10^{16}$ protons/cm$^2$ at 200 KeV are shown in FIG. 4. Although these results are qualitative, they emphasize that the visible photosensitivity of the FE→AFE phase transition shift is much higher than that of the AFE→FE transition.

Figure 5:
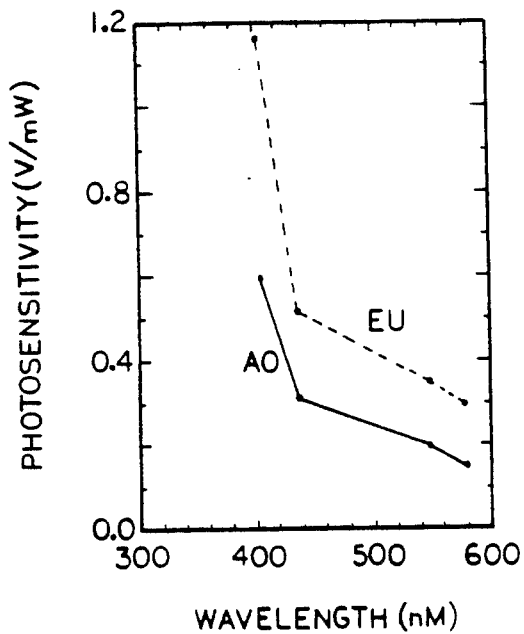
FIG. 5 is a plot of the qualitative photosensitivity (V/mW) versus wavelength of illuminating light for H$^+$-implanted PLZT 7.7/70/30 (Sample AO) and for Cr+Ne-implanted PLZT 7.6/70/30 (Sample EU).

A series of measurements similar to those described above were made on Sample AO using monochromatic rather than white light illumination at 404, 436, 546 and 579 nm. The results are summarized in FIG. 5 in terms of the FE→AFE phase transition voltage shift per milliwatt of illumination intensity versus wavelength of the illuminating light. Data for a sample of PLZT 7.6/70/30 (Sample EU) implanted with $10^{15}$ Cr ions/cm$^2$ at 500 keV + $10^{15}$ Ne ions/cm$^2$ at 500 Kev are also plotted in FIG. 5. The curves of FIG. 5 show that both samples maintain reasonably high photosensitivities in the visible and that the Cr+Ne implantation improves the visible photosensitivity compared to that of sample AO.

Figure 6:
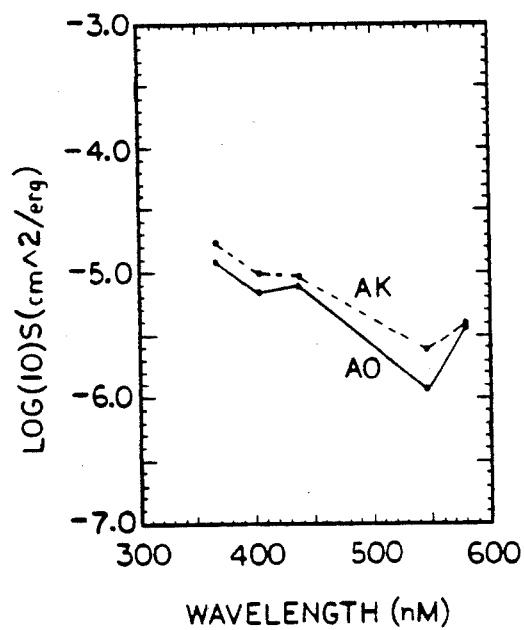
FIG. 6 is a plot of the Log$_{10}$ photosensitivity S versus wavelength for unimplanted PLZT 7.7/70/30 (Sample AK) and for H$^+$-implanted PLZT 7.7/70/30 (Sample AO).
Figure 7:
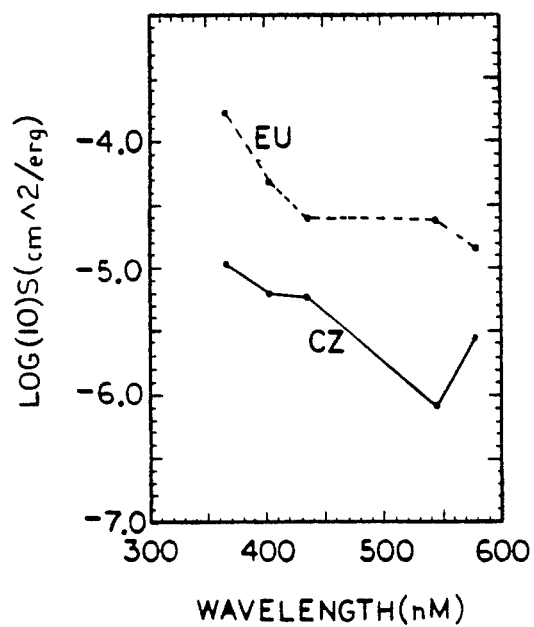
FIG. 7 is a plot of the Log$_{10}$ photosensitivity S versus wavelength for unimplanted PLZT 7.6/70/30 (Sample CZ) and for Cr+Ne-implanted PLZT 7.6/70/30 (Sample EU).

Quantitative measurements of photosensitivity as a function of wavelentgh were made for samples AK and AO, and the results are plotted in FIG. 6. It is noteworthy that the photosensitivity is essentially unaffected by the proton implantation is sample AO, and the photosensitivity of the implanted sample is actually slightly less than that of the unimplanted sample. Substantially different results were obtained for similar measurements on the PLZT 7.6/70/30 samples. The photosensitivity of an unimplanted sample (CZ) is improved an order of magnitude or more by Cr+Ne implantation (sample EU) as shown in FIG. 7. Since samples CZ and EU exhibit metastable FE phases, the experimental results suggest that the photosensitivity enhancement produced by ion implantation is comparable to that which would occur for FE phase compositions.

Figure 8:
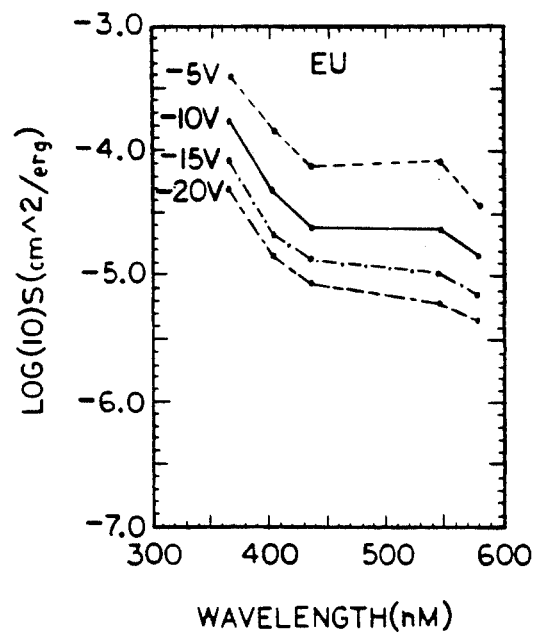
FIG. 8 is a plot of the Log$_{10}$ photosensitivity S versus wavelength for Cr+Ne-implanted PLZT 7.6/70/30 (Sample EU) for phase transition shift thresholds of 5, 10, 15 and 20 volts.

The threshold photosensitivities plotted in FIGS. 6 and 7 are calculated on the bases of a 10 volt shift in FE→AFE phase transition when the device is illuminated. For smaller shifts in the phase transition, the overall photosensitivity is increased; for larger shifts, the overall photosensitivity is decreased. This effect is illustrated in FIG. 8 where photosensitivity versus wavelength was plotted for sample EU for FE→AFE phase transition shifts of 5, 10, 15 and 20 volts. The wavelength dependence of the photosensitivity is essentially unaffected for the variation in phase transition shifts shown in FIG. 8.

Optical bistability is inherent in the above described storage process as a result of the coexistence of the two phases (the FE and the AFE) in the storage process. This offers an important advantage over the previously described photoferroelectric storage because of the reproducibility of the stored information within the PLZT material. It has obvious advantages for storage of binary information in applications such as high-density audio or video disc-type storage modes. In addition to this advantage, this storage process is sensitive to visible as well as near-UV light, and the extrinsic photosensitivity of this photoeffect appears to be much higher in unmodified PLZT than that previously observed for the intrinsic photoferroelectric effect in FE-phase or AFE-phase material.

What is claimed is:

1. A method of bistable storage of optical information comprising:

applying a switching electric field across a portion of a surface of a material capable of shifting between a stable antiferroelectric (AFE) and a ferroelectric (FE) phase, the switching field causing the portion of the material to shift from the AFE phase to the FE phase; and subsequently illuminating parts of the portion to cause the illumination parts to shift back to the AFE phase, whereby the difference in phase between the illuminated parts and the remainder of the portion of the surface represents spatially modulated information.

2. The method of claim 1, wherein the parts of the portion that were illuminated remain in the AFE phase and the parts of the portion that were unilluminated remain in the FE phase after the illumination and switching electric field are removed.

3. The method of claim 1, wherein the electric field is a dc bias field.

4. The method of claim 1, wherein the illumination is light within the spectral range of 350 nm to 800 nm wavelength.

5. The method of claim 1, wherein the optical information is binary optical information.

6. The method of claim 1, wherein the material is lead lanthanum zirconate titanate (PLZT).

7. The method of claim 6, wherein the composition of the PLZT is PLZT X/Y/Z, where $68 = <Y< =85$ and $32> =Z> =15$ and X is atom percent La, Y is mole percent PbZrO$_3$, and Z is mole percent PbTiO$_3$.

8. The method of claim 7, wherein the PLZT is PLZT 7.6/70/30 and the ferroelectric phase is metastable.

9. The method of claim 6, wherein the parts of the portion that were illuminated remain in the AFE phase and the parts of the portion that were unilluminated remain in the FE phase after illumination is removed.

10. The method of claim 9, wherein PLZT is PLZT 7.7/70/30.

11. The method of claim 10, wherein the FE phase is bias-stabilized with an applied electric field.

* * * * *